United States Patent

[11] 3,562,549

[72] Inventor Juergen Teichmann
Dresden, Germany
[21] Appl. No. 730,869
[22] Filed May 21, 1968
[45] Patented Feb. 9, 1971
[73] Assignee Arbeitsstelle Fur Molekularelektronik
Dresden, Germany

[54] SEMICONDUCTOR LOGIC CIRCUIT
7 Claims, 4 Drawing Figs.

[52] U.S. Cl. .......... 307/215, 307/237; 328/93
[51] Int. Cl. .......... H03k 19/36, H03k 5/08
[50] Field of Search .......... 307/215, 237, 253, 289, 300; 328/93

[56] References Cited
UNITED STATES PATENTS

| | | | |
|---|---|---|---|
| 3,445,680 | 5/1969 | Foster et al. | 307/215 |
| 3,458,719 | 7/1969 | Weiss | 307/215X |

*Primary Examiner*—John S. Heyman
*Assistant Examiner*—John Zazworsky
*Attorney*—Nolte and Nolte

ABSTRACT: A plurality of diode inputs is connected through a Zener diode clipper and amplifier circuit with a subsequent output stage so that the Zener voltage determines the initial shifting voltage level. To change this initial level, a conventional negator controls a transistor connected in parallel with said clipper and amplifier circuits, and turns off the latter in dependence on the output condition.

INVENTOR
JÜRGEN TEICHMANN

SEMICONDUCTOR LOGIC CIRCUIT

BACKGROUND OF THE INVENTION

1 Field of the Invention

This invention relates to a semiconductor or solid state integrated circuit for performing various logical functions, preferably an "and-not," (i.e.,NAND) function.

2. Description of the Prior Art

There have been known logic circuits for carrying out a NAND function, having a transfer characteristic $E_{out}=f(E_{in})$ without any hysteresis, in other words independent of direction. In these circuits, the sum of maximum permissible noise voltages in both logic levels may be, at best, equal to the logic amplitude. Should the static noise voltage be defined by a distance from the logic level to the 0.5 point from $dE_{in}/dE_{ou}$ on the transfer characteristic (taking into account the flattening of the curve), then the permissible noise voltage is smaller. Consequently, these known circuit arrangements are not suitable for an application in systems having high level of noise voltages.

It has been also known from prior art how to utilize for regulation purposes a property of a Schmitt trigger, known as hysteresis. This so called hysteresis is based on the fact that the trigger responds to a certain value of the input control voltage different from the voltage at which the trigger returns to its initial state. To increase the area of the hysteresis loop, there have been devised numerous circuit arrangements, such as, a trigger circuit in which an adjustable, bias voltage is derived from an output voltage and superimposed to the input voltage is applied in such a manner that the trigger output voltage is applied through a resistor to the base of a transistor. The emitter of this transistor is connected to an input terminal of the trigger, whereas the collector thereof is connected through an adjustable resistor with the second trigger input terminal and, through a further resistor to a constant potential.

There are also known logic circuits having hysteresis. These circuits are mostly employed in a special logic circuitry, for example in an emitter coupled logic, and have the drawback that the permissible noise voltage must be low with regard to the supply voltage. In addition, the number of employed parts is frequently too large.

Therefore, the primary object of this invention is to create a logic circuit having a reduced number of circuit components.

Another object of this invention is to provide a circuit which is easy to manufacture and is reliable in operation.

Further object of this invention is to provide a circuit which complies with general requirements for logic circuitry, i.e. which is unaffected by the relatively high tolerances of the parts used, compatible etc.

Still another object of this invention is to create a diode-transistor logic (DTL) circuit permitting safe operation despite the noise voltages present in both logic states.

In accordance with the present invention the above objects are attained by the initial shifting voltage clipper and amplifier circuit being automatically switched over in response to a characteristic line movement. The switching action is carried out by means of a conventional negator circuit controlled by the logic output and controlling in turn a base of a transistor which is connected in parallel to the first shifting voltage clipper and amplifier. By means of this novel arrangement it is possible to provide in both logic states ("0"and "1") such a safeguard against noise voltages which almost approaches the maximum theoretical limit. The resulting circuit may consequently be employed in systems having a very high level of noise.

BRIEF DESCRIPTION OF THE DRAWINGS

Further features and objects of this invention will become apparent from the following detailed specification with reference being had to the drawing, wherein.

DESCRIPTION OF THE PREFERRED EMBODIMENTS

Figure 1:
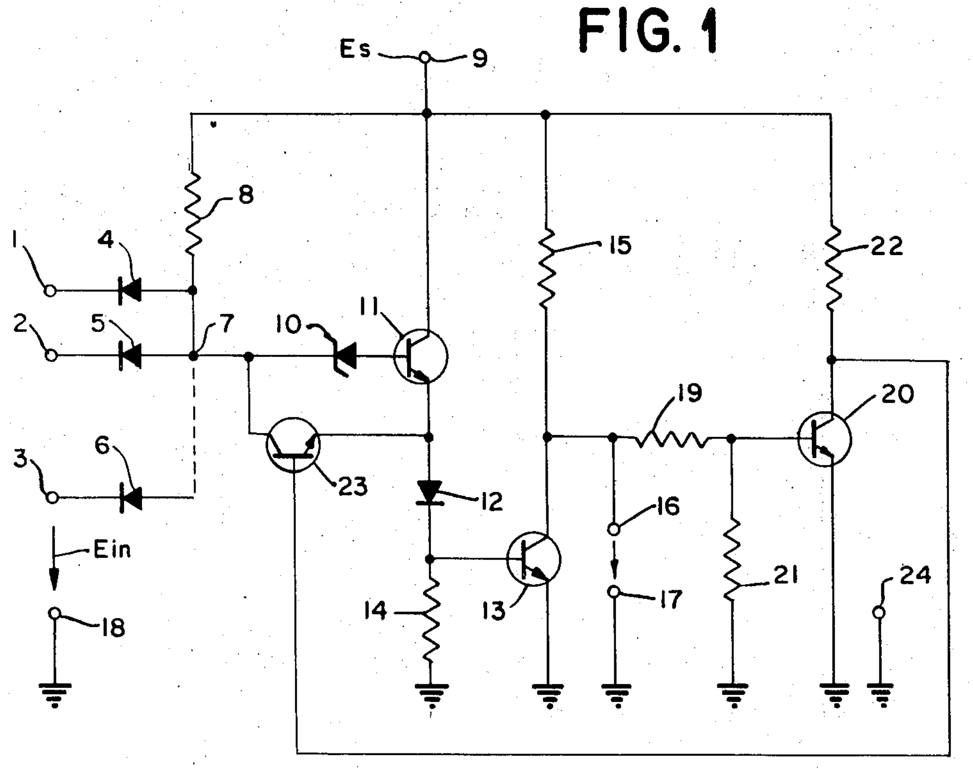
FIG. 1 is a schematical diagram of a preferred embodiment of the logic circuit of this invention.

In FIG. 1, there is shown a logic NAND circuit comprising a plurality of input diodes 4, 5 and 6, the cathodes of which are connected to input terminals 1, 2 and 3 whereas the anodes thereof lie at a common point 7 from which they are coupled through resistor 8 to the supply voltage $E_s$ terminal 9. The opposite pole of the supply voltage is applied to the ground terminal 24. Respective input voltages $E_{in}$ are applied between the respective input terminals 1, 2 and 3 and the ground terminal 18. In the present illustration, the input voltage is applied at terminal 3 and ground. The common point 7 is coupled to the output transistor 13 through a combination of a voltage clipping Zener diode 10 with a current amplifying transistor 11 operating in a common collector connection. Zener diode 10 is therefore, coupled to the base of transistor 11 while the collector of transistor 11 is directly connected to the supply voltage source terminal 9, and the emitter is coupled via a diode 12, poled in the forward direction, to the base of output transistor 13. The collector of the transistor 13 is connected to the terminal 9 via a load resistor 15. An output voltage $E_{out}$ is obtained across the output terminals 16 and 17. The emitter of transistor 13 is grounded and a resistor 14 is connected between the base and emitter. A conventional negator circuit is coupled to the output 16, 17 of the above-described logic circuit. For this purpose, the output terminal 16 is connected through a resistor 19 with the base of a transistor 20, connected as a common emitter amplifier, and a resistor 21 is coupled between the base and ground. The collector of transistor 20 is loaded by a resistor 22 and coupled to the base of a further transistor 23 the collector-emitter path of which is connected in parallel with the Zener diode clipper 10 and current amplifying transistor 11. The collector of transistor 23 is connected to common point 7, whereas the emitter thereof is coupled to the anode of the diode 12.

The mode of operation of the above-described circuit is as follows:

If the input voltages $E_{in}$ applied to input terminals 1–18; 2–18 and 3–18 exceed the Zener voltage of Zener diode 10 (reduced by the forward voltage drop of two diodes), the current through the resistor 8 will be amplified by the current amplification factor of transistor 11 and applied via the diode 12 to the base of transistor 13, thereby saturating transistor 13. Transistor 20 will be cut off and transistor 23 becomes saturated so that across its collector-emitter path there is a lower voltage than that of the Zener diode. The current through resistor 8 is now applied directly, without amplification, via the collector-emitter path of transistor 23 and diode 12 to the base of transistor 13 and as a result, the saturation thereof is of a lesser degree. From this moment on, the Zener voltage operates no longer as a level shifting voltage, which function is now accomplished by the saturation voltage of transistor 23. To shift back the output voltage level across terminals 16—17, it is necessary to reduce at least one of the input voltages $E_{in}$ which in the illustrated example is the voltage to diode 6 across input terminals 3–18, to a level approximately below the forward bias of the input diodes. In this case the current through resistor 8 starts flowing through diode 6, transistor 13 becomes cut off, transistor 20 will be turned on via the resistor 19 and, consequently, transistor 23 will be cut off.

Only when all input voltages (to the NAND circuit) exceed the Zener voltage reduced by the forward bias of two diodes, can the logic circuit of this invention change its state again.

Figure 2:
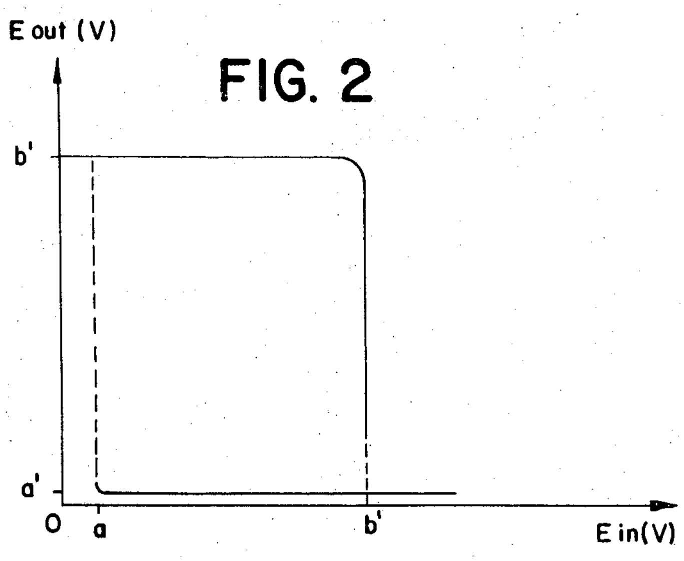
FIG. 2 is a hysteresis curve of the circuit of FIG. 1.

As shown in FIG. 2, the output level $a'—b'$ is maintained within broad limits $a—b$ of input voltages $E_{in}$.

Figure 1A:
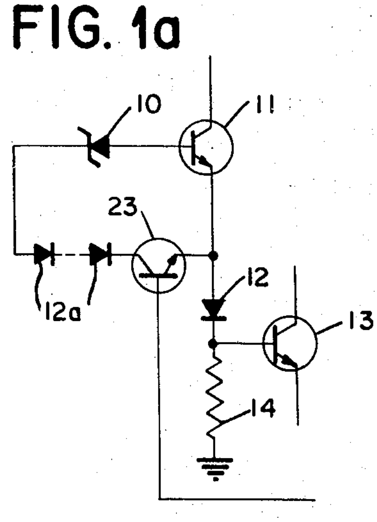
FIGS. 1*a* and 1*b* are schematic diagrams of variations of a portion of the logic circuit of FIG. 1.
Figure 1B:
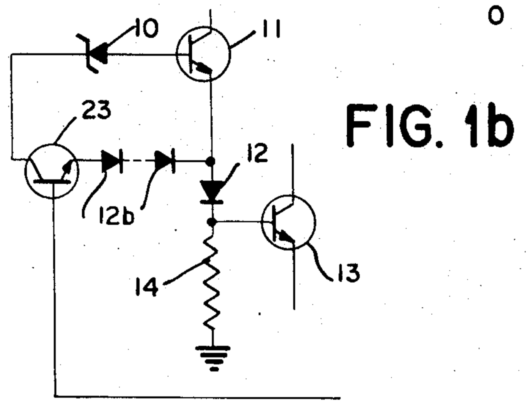

It is to be understood that the above embodiment as described is intended only to illustrate one of many possible modifications. For example, it is within the scope of this invention to provide means for switching a plurality of Zener diodes, and a plurality of switchable diodes in the emitter or collector leads of the transistor 23 (as illustrated in FIGS. 1*b* and 1*a*, respectively) to attain controlling of threshold voltages in both levels. In another variation it is possible to replace the Zener diode by a number of forward poled conventional diodes. Also, it is evident that an inverted output signal can be picked up from the collector of the negator transistor 20.

I claim:

1. A semiconductor logic circuit comprising diode input means for receiving at least one input voltage, an output controlling stage producing at its output a logic voltage level, a clipping stage connected between said input means and said output controlling stage to pass a control signal therethrough when said input voltage exceeds a predetermined first level, a negator stage connected to the output of said output controlling stage, and a switching stage coupled in parallel with said clipping stage and controlled by said negator stage to pass a control signal to said output controlling stage at a second input voltage level different from said first level.

2. The logic circuit according to claim 1, wherein said clipping stage includes an amplifying means and at least one Zener diode connected to said input means, a current amplifying transistor having a base electrode thereof connected to said Zener diode and having the emitter electrode thereof coupled to said output control stage through a forward poled diode.

3. The logic circuit according to claim 1, wherein said switching stage comprises a transistor device having base, emitter and collector electrodes, and a plurality of diodes arranged in series in the emitter-collector path of said switching stage, said emitter-collector path being connected in parallel with said clipping stage, and means connecting said emitter to said negator stage.

4. A semiconductor logic circuit comprising a source of operating voltage having first and second terminals, a current path connected between said first and second terminals and comprising in the order named a resistor, a voltage clipping device, a first amplifying means, and output amplifying means; a plurality of input terminals, separate diode means for connecting said input terminals to the junction of said resistor and voltage clipping device, whereby said output amplifying means produces a first output logic voltage level when the voltage at said input terminals exceeds a given voltage level; and circuit means connected to the output of said output amplifying means and responsive to said first output voltage level for establishing a current path in parallel with said voltage clipping device and first amplifying means.

5. The semiconductor logic circuit of claim 5 wherein said circuit means comprises a transistor having its collector-emitter path connected in parallel with said voltage clipping device and first amplifying means, a transistor amplifier connected to said output of said output amplifying means, and means connecting the output of said transistor amplifier to the base of said transistor.

6. The semiconductor logic circuit of claim 5 wherein said current path further comprises a diode connected between said first amplifying means and said output amplifying means.

7. The semiconductor logic circuit of claim 5 wherein said first amplifying means comprises a transistor having its base connected to one terminal of said voltage clipping device, its collector connected to said first terminal, and means connecting the emitter of said transistor to said output amplifying means.

UNITED STATES PATENT OFFICE

CERTIFICATE OF CORRECTION

Patent No. 3,562,549 Dated Feb. 9, 1971

Inventor(s) JÜRGEN TEICHMANN

It is certified that error appears in the above-identified patent and that said Letters Patent are hereby corrected as shown below:

In the first line of each of the claims 5, 6, and 7 "Claim 5" should read -- Claim 4 --.

Signed and sealed this 25th day of May 1971.

(SEAL)
Attest:

EDWARD M.FLETCHER,JR.
Attesting Officer

WILLIAM E. SCHUYLER, J
Commissioner of Patent